United States Patent [19]

Kumar et al.

[11] 4,413,061
[45] Nov. 1, 1983

[54] GLASS-CERAMIC STRUCTURES AND SINTERED MULTILAYER SUBSTRATES THEREOF WITH CIRCUIT PATTERNS OF GOLD, SILVER OR COPPER

[75] Inventors: Ananda H. Kumar, Wappingers Falls, N.Y.; Peter W. McMillan, Warwick, England; Rao R. Tummala, Wappingers Falls, N.Y.

[73] Assignee: International Business Machines Corporation, Armonk, N.Y.

[21] Appl. No.: 276,236

[22] Filed: Jun. 22, 1981

Related U.S. Application Data

[62] Division of Ser. No. 875,703, Feb. 6, 1978, Pat. No. 4,301,324.

[51] Int. Cl.$^3$ ............ C03C 3/22; H05K 3/34
[52] U.S. Cl. .................. 501/7; 29/840; 65/33
[58] Field of Search ............ 29/840, 851, 830; 357/73; 427/125; 264/61; 252/514; 106/1.13; 501/7, 9; 156/89; 65/33

[56] References Cited

U.S. PATENT DOCUMENTS

| | | |
|---|---|---|
| 2,920,971 | 1/1960 | Stookey . |
| 2,971,853 | 2/1961 | Stookey . |
| 3,231,456 | 1/1966 | McMillan et al. ............... 501/7 X |
| 3,497,366 | 2/1970 | Simmons .......................... 501/7 |
| 3,726,006 | 4/1973 | Muckelroy ...................... 357/73 X |
| 3,790,360 | 2/1974 | Kato et al. ........................ 65/33 X |
| 3,839,001 | 10/1974 | Adams et al. .................... 501/7 X |
| 3,997,352 | 12/1976 | Beall ................................. 501/7 X |
| 4,015,048 | 3/1977 | Martin ............................... 501/9 X |

FOREIGN PATENT DOCUMENTS 1157755  7/1969  United Kingdom ................ 501/7

OTHER PUBLICATIONS

IBM Tech. Discl. Bulletin, vol. 14, No. 9, Feb. 1972, p. 2581, by L. C. Anderson et al.

Primary Examiner—Howard N. Goldberg
Assistant Examiner—Carl J. Arbes
Attorney, Agent, or Firm—Henry Powers

[57] ABSTRACT

Sintered glass-ceramic substrates containing multi-level, interconnected thick-film circuit patterns of highly conductive metals such as gold, silver or copper are provided which can be fired in air (for gold and silver) or in neutral atmospheres (for copper) at temperatures below the melting points of these metals. This has been made possible by the discovery that finely divided powders of certain glasses described herein sinter to essentially zero porosity at temperatures below 1000° C. while simultaneously maturing to glass-ceramics of low dielectric constant, high flexural strength and low thermal expansivity.

20 Claims, 4 Drawing Figures

GLASS-CERAMIC STRUCTURES AND SINTERED MULTILAYER SUBSTRATES THEREOF WITH CIRCUIT PATTERNS OF GOLD, SILVER OR COPPER

This is a division of application Ser. No. 875,703 filed Feb. 6, 1978, now U.S. Pat. No. 4,301,324, issued Feb. 6, 1978.

FIELD OF THE INVENTION

This invention relates to glass-ceramic structures and, more particularly, to thick or thin film or hybrid, interconnected multilayer substrates made of sintered glass-ceramic insulator and conducting patterns made of thick film gold, silver or copper (for electronic devices). Also, this invention relates to the process and materials for producing such substrates starting with certain glass powders and conductor "inks" or "pastes" containing finely divided powders of gold, silver or copper by the so-called "laminated green sheet" technique at firing temperatures not exceeding the melting points of the conductor metal employed. The substrates may be designed with termination pads for attaching semiconductor chips, connector leads, capacitors, resistors, covers, etc. Interconnections between buried conductor layers can be achieved through the so-called "vias" formed by metal-paste-filled holes in the individual layers formed prior to lamination which upon sintering will become densely sintered metal interconnections.

DESCRIPTION OF THE PRIOR ART

The "laminated green sheet" process for fabricating multilayer substrates of alumina, mullite and other refractory ceramics are adequately described in prior art (such as U.S. Pat. No. 3,423,517 and 3,723,176). While the procedures of this invention are similar to those described in the above patents, important changes are incorporated therein to allow for the use of glass powders of this invention.

Alumina ($Al_2O_3$), because of its excellent insulating properties, thermal conductivity, stability and strength is generally the material of choice for substrate fabrication. However, for certain high performance applications the relatively high dielectric constant, hereinafter designated by the letter "K", of alumina (K $Al_2O_3 \sim 10$) entails significant signal propogation delays and noise. In addition, the high maturing temperatures of commercial aluminas ($\sim 1600°$ C.) restrict the choice of co-sinterable conducting metallurgies to refractory metals such as tungsten, molybdenum, platinum, palladium or combinations of these with each other or with certain other metals and precludes the sole use of good electrical conductors such as gold, silver, or copper because these latter will be molten much before the sintering temperature of alumina is reached. A further disadvantage of alumina is its relatively high thermal expansion coefficient ($\sim 65-70 \times 10^{-7}/°C.$) compared to that of silicon semiconductor chips ($\sim 35 \times 10^{-7}/°C.$) which may, in certain cases, result in some design and reliability concerns.

Glass Ceramics

Stookey, in his basic patent U.S. Pat. No. 2,920,971 on glass-ceramics, has described in detail the theoretical concepts and production techniques for such products. In brief, glass-ceramics are obtained through the controlled, in-situ, crystallization of a glass body of proper composition brought about by a two-step heat treatment procedure. The glass composition generally includes substances called nucleating agents examples of which are $TiO_2$, $ZrO_2$, $P_2O_5$, $SnO_2$ and certain colloidal metal particles. The resultant body is composed of a multitude of fine grained crystals of substantially uniform size homogeneously dispersed in a glassy matrix, the crystal phase constituting the major portion of the body. The high degree of crystallinity, their very small dimensions and the absence of porosity make these glass-ceramics generally superior in strength to the precursor glasses and other properties such as thermal expansivity, chemical durability etc. closely resemble those of the crystalline phase formed.

The glass-ceramic bodies made in accordance with the above or similar methods wherein a glass article shaped by conventional glass making techniques such as drawing, pressing, blowing etc. of hot, plastic glass mass followed by conversion to the glass-ceramic state by suitable heat treatments will be, hereinafter, referred to as "bulk-crystallized" or simply as "bulk" glass-ceramics to distinguish them from the sintered glass-ceramics of this invention.

There have been references to sinterable glass-ceramics in prior art but these are not suitable for the present application for one reason or another. For example, U.S. Pat. No. 3,825,468 refers to sintered glass-ceramic bodies which are porous in the interior and non-porous in the exterior surfaces. Such bodies would have low rupture strengths due mainly to the internal porosity, with typical flexural strengths of less than 10,000 psi. Furthermore, the final sintering temperatures for these glass-ceramics would be well in excess of 1000° C. and hence above the melting points of gold, silver and copper. Another example in U.S. Pat. No. 3,450,546 which describes non-porous, transparent, sintered glass-ceramics produced by sintering in vacuum at temperatures above 1200° C. Helgesson (see "Science of Ceramics", pp. 347–361, published by the British Ceramic Society, 1976) describes the sintering of a glass powder of composition 53 wt.% $SiO_2$, 26 wt.% $Al_2O_3$ and 21 wt.% MgO. They could obtain dense, corderite glass-ceramics at a sintering temperature of about 950° C. provided the glass powder was given a prior chemical treatment in an alkali solution. In the absence of this treatment, they found that it was not possible to sinter the glass powder due to premature surface crystallization.

Numerous glass compositions allow sintering to dense bodies at temperatures below 1000° C. but are unsuitable for the purpose of this invention owing to the fact the relatively high fluidity (viscosity of $10^5$ to $10^8$ poises) at the sintering temperature would result in excessive movement of the buried conductor patterns and otherwise prevent the attainment of the rigid tolerances for dimensions and distortion that have to be met. The rupture strengths of glasses, typically about 10,000 psi, are also much lower than desired for this application. The glasses of the compositions described herein undergo crystallization during the sintering heat treatment forming pervasive rigid networks of micron-sized crystallites which drastically reduces the overall fluidity of the body thereby enabling greater dimensional and distortional control. This very crystallization of refractory phases in the glass during sintering however, can militate against the realization of dense sintering. In the two types of glass-ceramics described in this invention, certain principles, described hereinafter, have been discovered that enable one to overcome this difficulty.

SUMMARY OF THE INVENTION

Accordingly, the primary object of this invention is to provide glass-ceramic bodies, having low dielectric constants and other useful properties for substrate applications, which can be easily obtained by the sintering of certain glass powders and concurrent conversion into glass-ceramics at lower temperatures than similar materials known from prior art.

Another object is to provide materials of lower dielectric constant than prior inorganic materials used in multilayer substrate applications.

A further object is to provide new glass-ceramic compositions suitable for the production of such bodies which are characterized as essentially non-porous and which possess microstructures consisting of networks of fine crystallites with the residual glass and secondary crystallites occupying the interstitial spaces of such networks. This unique microstructure imparts to these glass-ceramics rupture strengths substantially higher than in sintered glass-ceramics know from prior art.

Another object is to provide multilayer glass-ceramic substrates which are compatible with thick film circuitry of gold, silver or copper and co-fireable therewith.

Another object is to provide multilayer substrates having thermal expansion coefficients closely matched to that of silicon semiconductor chips.

Yet another objective is to provide a method for fabricating multilayer substrates of glass-ceramics with conductor patterns of gold, silver or copper.

To these and other ends, the invention embodies among its features a method of making the body by the said method, new compositions for making the body by the said method, an article comprising the body and a method of making the article, hereinafter referred to as a "multilayer glass-ceramic substrate".

DESCRIPTION OF THE PREFERRED EMBODIMENTS

Figure 1:
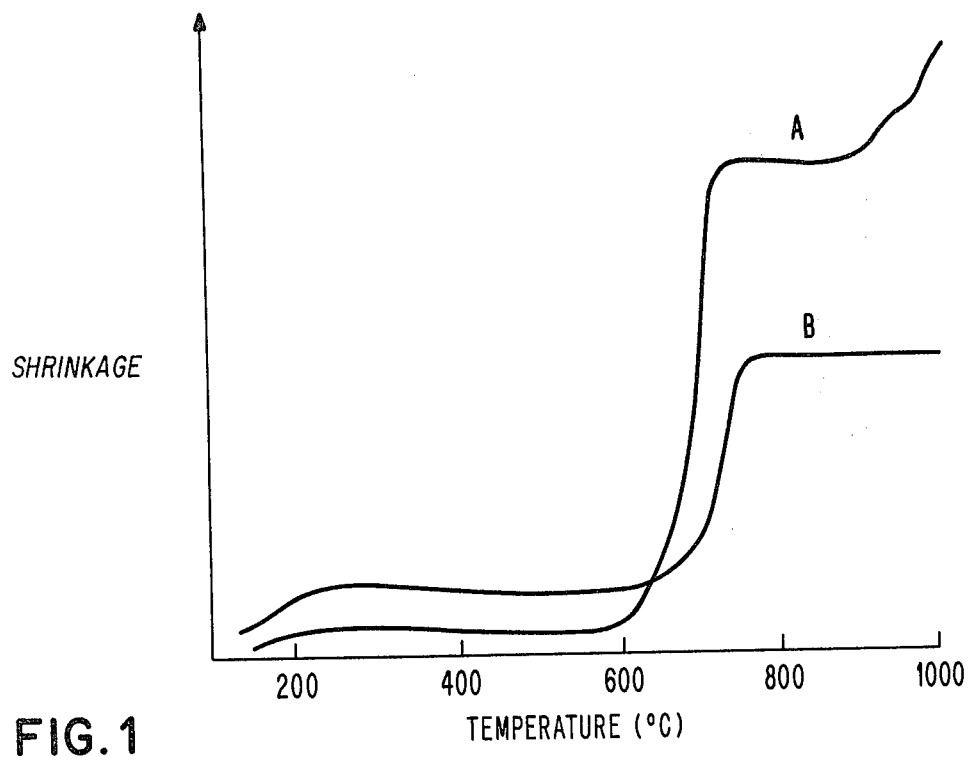
FIG. 1 shows typical dilatometric shrinkage curves of β-spodumene glass ceramics of this invention.

Of the two types of glass-ceramics of this invention, one has β-spodumene, $Li_2O.Al_2O_3.4SiO_2$ as the principal crystalline phase while the other has cordierite, $2MgO.2Al_2O_3.5SiO_2$, as the main crystalline phase. The common feature of these sintered glass-ceramics, apart from their excellent sinterability below 1000° C., is a microstructure that can be described as composed of networks that are highly crystalline, the interstices of which are occupied by small amounts of the residual glass and some discrete secondary crystallites. Such microstructures differ from those observed in "bulk" glass-ceramics in that in the latter the glassy phase forms the matrix or the network with discrete crystallites dispersed in it. We believe that the unique microstructures observed in the glass-ceramics of this invention give rise to their high flexural strengths.

The general composition range of the glass-ceramics applicable for this invention are given in Table I.

TABLE I
COMPOSITION RANGES (WEIGHT PERCENTAGES)

| | β-Spodumene Type | Cordierite Type |
|---|---|---|
| $SiO_2$ | 65 to 75 | 48 to 55 |
| $Al_2O_3$ | 12 to 17 | 18 to 23 |
| MgO | 0 to 2 | 18 to 25 |
| CaO | ⎫ | — |
| BaO | ⎬ (alone or combined) | |
| ZnO | 0 to 2 | 0 to 2 |
| $Li_2O$ | 3.5 to 11 | 0 to 1 |
| $Na_2O$ | ⎫ 1.0 to 3.5 | — |
| $K_2O$ | ⎬ (alone or combined) | — |
| $B_2O_3$ | 0 to 2.5 | 0 to 3 |
| $P_2O_5$ | 0 to 2.5 | 0 to 3 |
| $TiO_2$ | 0 to 3 | 0 to 2.5 ⎫ |
| $SnO_2$ | | 0 to 2.5 ⎬ Total not to exceed 5.0 |
| $ZrO_2$ | | 0 to 2.5 ⎭ |
| F | 0 to 3 | — |

The ranges of constituents of the above glass-ceramics that will yield satisfactory materials are determined by several factors. Important among these are:
(a) The requirement for the glass-ceramic to sinter to zero apparent porosity at temperatures below 1000° C., and preferably in the vicinity of 950° C.
(b) The requirement for the thermal expansion coefficient, measured in the temperature range of 20°–300° C., of the glass-ceramic to be in the range of 20 to $40 \times 10^{-7}/°C$. and preferably to be close to $30 \times 10^{-7}/°C$.

Sinterable β-Spodumene Glass-Ceramics $SiO_2$ and $Al_2O_3$ contents greater than the upper limits given in Table I would not allow satisfactory sintering to be achieved. Also, the $Li_2O$ content should not fall below seven percent except when either $B_2O_3$ and F act as fluxes and therefore facilitate sintering; they have the added advantage of assisting melting and refining of the glasses. The sodium and potassium oxides are essential constituents since they promote the formation of binary lithium silicates, particularly the metasilicate as a minor crystalline phase which, as discussed below, plays a major role in the sintering process.

The $SiO_2$ and $Al_2O_3$ contents must also fall within the specified ranges to ensure the development of the desired volume fraction of β-spodumene to enable the correct thermal expansion coefficient to be attained as well as to ensure high strength. The $P_2O_5$ and $TiO_5$ are desirably included to promote internal nucleation of the glass grains; inclusion of $ZrO_2$ also assists internal nucleation.

Specific Compositions

Examples of specific compositions are given in Table II as follows:

TABLE II
COMPOSITIONS OF βSPODUMENE GLASS-CERAMICS

| Glass No. | 1 | 2 | 3 | 4 | 5 | 6 | 7 |
|---|---|---|---|---|---|---|---|
| $SiO_2$ | 71.5 | 74.9 | 71.0 | 71.5 | 71.5 | 71.0 | 67.8 |

TABLE II-continued

| COMPOSITIONS OF βSPODUMENE GLASS-CERAMICS | | | | | | | |
|---|---|---|---|---|---|---|---|
| Glass No. | 1 | 2 | 3 | 4 | 5 | 6 | 7 |
| $Al_2O_3$ | 15.0 | 7.5 | 13.0 | 13.0 | 13.0 | 15.0 | 16.0 |
| MgO | — | — | — | — | — | — | 1.5 |
| CaO | — | — | — | — | — | — | 4.5 |
| BaO | — | 2.0 | 2.0 | — | — | — | — |
| ZnO | — | 2.1 | 2.5 | 2.0 | 2.0 | 2.0 | — |
| $Li_2O$ | 10.0 | 8.8 | 8.0 | 10.0 | 8.0 | 8.0 | 4.2 |
| $Na_2O$ | — | — | — | — | — | — | 0.9 |
| $K_2O$ | 2.0 | 3.1 | 2.0 | 2.0 | 2.0 | 2.0 | — |
| $B_2O_3$ | — | — | — | — | 2.0 | 0.5 | 1.8 |
| $P_2O_5$ | 1.5 | 1.6 | 1.5 | 1.5 | 1.5 | 1.5 | — |
| $TiO_2$ | — | — | — | — | — | — | 2.5 |
| F | — | — | — | — | — | — | 0.8 |
| Sintering Temp. (°C.) | 925 | 850 | 990 | 900 | 855 | * | 910 |
| Thermal Exp. Coeff. (°C.$^{-1}$ × 10$^{-7}$) | 32 | 83 | 60 | 43 | 29 | — | 20 |
| Modulus of Rupture (psi) | 30,000 | 67,000 | 10,400 | 63,400 | 30,000 | — | 25,200 |
| K (permittivity) | 6.5 | — | 6.5 | 6.3 | 6.4 | — | 5.0 |

*did not sinter satisfactorily at temperatures below 1000° C.

These glasses were melted at temperatures close to 1500° C. from mixtures of suitable raw materials until free from unreacted material and gas bubbles. The molten glass was quenched by pouring it into cold water to produce "cullet" suitable for further grinding. The "cullet" was ground to average particle sizes ranging from 3–7 μm and mixed with suitable organic binders and solvents to obtain a castable slip or slurry from which thin sheets were cast using conventional doctor blading techniques. The bodies were prepared by laminating a desired number of these sheets in a laminating press at moderate temperatures and pressures (e.g. 100° C. and 3000 psi) to obtain a monolithic "green" body. Specimens for the measurement of rupture strength, thermal expansion coefficient and dielectric constant measurements were formed as above and fired in air using programmed furnaces. Prior experimentation had showed that the heating rate should be low, not greater than 2° C./minute; faster heating rates resulted in incomplete binder burnout. It is also believed that the use of a relatively slow heating rate is advantageous in allowing surface and internal nucleation processes to be completed in a controlled manner.

The modulus of rupture of the sintered glass-ceramics was measured in a 3-point bending mode on bar specimens and in general the mean of ten (10) determinations was calculated. Thermal expansion coefficients were measured in the range from room temperature to 300° C. using two-point method. Dielectric constants were determined at a frequency of 1 MHZ at 25° C.

Typical values of these properties are quoted in Table II. In general, the sintering temperatures given are those yielding optimum results but it should be understood that for each material, a sintering range exists usually extending 20° C. above and below the optimum temperature. The optimum holding time at the sintering temperature was two hours, though times ranging from one to five hours also give satisfactory results.

Of the compositions given in Table II, glasses #1, #4, #5, and #7 yielded glass-ceramics having properties suitable for the present multilayer substrate application. Compositions #3 and #6 failed to sinter satisfactorily below 1000° C. and composition #2, while it yielded a high strength material, resulted in a glass-ceramic of thermal expansion coefficient outside the desired range.

X-ray diffraction analysis showed that glass ceramics #1, #4 and #5 contained β-spodumene as the major phase and a lithium meta and disilicates as minor phases. Composition #2 contained only a very small amount of β-spodumene plus a major amount of an unidentified crystal phase. Composition #3 contained β-spodumene as the major phase along with minor amounts of lithium metasilicate and disilicate.

On this basis, it is believed that β-spodumene should be present as a major phase to enable the desired thermal expansion coefficient to be obtained but that binary lithium silicates must also be present as minor phases to promote sintering and densification of the glass-ceramics at temperatures below 1000° C.

Dilatometric shrinkage measurements of green laminates as a function temperature illustrate very well the differences between those materials containing lithium metasilicate as a minor phase and those that do not contain this phase. Curve A, FIG. 1, is typical of the former type (e.g. composition #1) and Curve B, FIG. 1 of the latter type of material (e.g. glasses #2 and #6). For the satisfactory material (Curve A) densification commences at a temperature of about 580° C. At this stage, the material is still uncrystallized glass. At a temperature of about 610° C., however, further densification is arrested owing to the onset of crystallization. A second densification stage commences at about 910° C. and this proceeds until the glass-ceramic becomes nonporous. For the unsatisfactory materials (Curve B), the second densification stage is absent at temperatures below 1000° C.

Differential thermal analysis, x-ray diffraction analysis and electron microscopic studies have indicated that the commencement of the second stage of the sintering process corresponds to the liquidus temperature of lithium metasilicate phase. Some of the metasilicate recrystallizes on cooling the glass-ceramic.

It is believed that the satisfactory sintering of these β-spodumene glass-ceramics involves the following steps. Initial sintering of the glass powder by viscous flow and diffusion processes, possibly also assisted by glass-in-glass phase separation, occurs between 580°–600° C. As a result of surface nucleation processes, the individual glass grains become covered with a layer of lithium metasilicate. Internal nucleation within the glass grains follows causing the precipitation of β-spodumene crystals, whose maximum size will be set by the particle diameter. Further sintering then requires the partial or complete melting of the metasilicate phase which brings about (i) consolidation of the β-spodumene grains by capillary forces and (ii) neck or bridge formation between the β-spodumene particles promoted by the reaction of the molten metasilicate with the alumina and silica of the residual glass to form further quantities of β-spodumene. At temperatures above the recommended sintering range, the metasilicate appears to flux the β-spodumene destroying the inter-particle bridges. The reaction of the lithium metasilicate 3.5% of at least one oxide selected from the group consisting of $Na_2O$ and $K_2O$.

Conversely, as used herein and in the claims, the term "β-spodumene glass ceramic" is defined as and restricted to a glass ceramic structure coalesced and crystallized from "β-spodumene glasses" into an article having a microstructure of a pervasive continuous network of 2 to 5 μm crystallites of β-spodumene with the interstices of said network occupied by residual glass having dispersed therein discrete secondary 1 to 2 μm crystallites of lithium metasilicate.

Sinterable Cordierite Glass-Ceramics

The overall composition ranges of the cordierite glass-ceramics of this invention is given in Table I and specific examples are listed in Table III.

TABLE III

| | CORDIERITE GLASS-CERAMICS (Weight % Compositions) | | | | | | | | | | | |
|---|---|---|---|---|---|---|---|---|---|---|---|---|
| Glass No. | 8 | 9 | 10 | 11 | 12 | 13 | 14 | 15 | 16 | 17 | 18 | 19 |
| MgO | 24 | 24 | 24.2 | 21.5 | 22 | 23 | 22 | 23.5 | 23.5 | 24.0 | 24.0 | 24.7 |
| $Al_2O_3$ | 21 | 21 | 21.2 | 21 | 22 | 22 | 22 | 21 | 21 | 21.0 | 21.84 | 21.0 |
| $SiO_2$ | 53 | 52 | 50.6 | 52.5 | 52.5 | 52 | 52 | 52.5 | 52.5 | 52.5 | 52.5 | 51.8 |
| $P_2O_5$ | 2 | 2 | 2.0 | 2 | 1.5 | 2 | 2 | — | — | 1.0 | 1.16 | 1.0 |
| $Li_2O$ | — | 1 | — | — | — | — | — | — | — | — | — | — |
| $B_2O_3$ | — | — | 2.0 | 1 | 0.5 | 1 | 1 | 1 | 1 | 0.5 | 0.5 | 0.5 |
| $ZrO_2$ | — | — | — | 2 | 1.5 | — | — | — | — | — | — | — |
| ZnO | — | — | — | — | — | — | 1 | — | — | — | — | 1.0 |
| $TiO_2$ | — | — | — | — | — | — | — | 2 | — | — | — | — |
| $SnO_2$ | — | — | — | — | — | — | — | — | 2 | — | — | — |
| Sintering Temp. (°C.) | 1050 | 960 | 925 | 925 | 950 | 967 | 967 | 967 | 970 | 970 | 972 | 925 |
| Thermal Expansion Coeff. (°C.$^{-1}$ × 10$^{-7}$) | 37 | 55 | 30 | 33 | 24 | 23 | 24 | 30 | 33 | 33 | 34 | |
| Modulus of Rupture (psi) | 30,500 | 42,300 | 29,000 | 42,300 | 82,300 | 39,000 | 52,000 | 39,800 | 30,200 | 30,200 | 30,800 | 46,500 |
| Permittivity (k) | | | 5.6* | 5.7** | | 5.3* | 5.4* | 5.7* | 5.6* | 5.6* | 5.7* | 5.5* |

*Frequency 1 MHz
**Frequency 1 KHz with residual glass to form β-spodumene in certain $Li_2O$-$Al_2O_3$-$SiO_2$ systems has also been alluded to by Stookey in U.S. Pat. No. 2,971,853.

Figure 2:
FIG. 2 is a photomicrograph of a sintered β-spodumene glass ceramic of this invention, by scanning electron microscope (SEM) 1000X.

The microstructure of the glass-ceramics obtained from such a sintering mechanism consists of cosintered β-spodumene crystals forming rigid skeletal structures with the residual glass occupying the interstitial regions in such a structure. FIG. 2 is an example of such a microstructure which more resembles those of conventional ceramics obtained by sintering ceramic powders, such as alumina with minor glass additions than those of "bulk" glass-ceramics. The absence of a continuous glassy matrix or network is believed to be the principal factor governing the high flexural strengths of the present materials.

It is to be understood that as used herein and in the claims, the term "β-spodumene glass" is defined as and restricted to (1) a precursor for β-spodumene glass ceramic and (2) formed from a batch consisting of, by weight:

| $SiO_2$ | 65 to 75% | $LiO_2$ | 3.5 to 11% |
|---|---|---|---|
| $Al_2O_3$ | 12 to 17% | $B_2O_3$ | 0 to 2.5% |
| MgO | 0 to 2% | $P_2O_5$ | 0 to 2.5% |
| ZnO | 0 to 2% | F | 0 to 3%, | and also from 0 to 2% of at least one oxide selected from the group consisting of CaO and BaO, and from 1.0 to The composition limits are set on the one hand by the need to ensure that cordierite appears as the major crystalline phase in order to achieve desired thermal expansion coefficients and on the other to facilitate sintering below 1000° C. Reduction of MgO and $Al_2O_3$ contents below the specified limits is not permissible for this reason. Excessively high $Al_2O_3$ and $SiO_2$ contents would result in materials not capable of sintering below 1000° C. MgO contents higher than the specified maximum could result in the formation of magnesium silicates in significant amounts causing the thermal expansion coefficients to be higher than desired.

The minor constituents are included to perform important functions. The $P_2O_5$, $ZrO_2$, $TiO_2$ and $SnO_2$ are added to promote nucleation and to regulate the microstructural development. The $Li_2O$ and $B_2O_3$ are included as sintering aids; they also serve to regulate the nature of the crystalline phase formed. Cordierite can appear in either the μ or α form. Sometimes, mixtures of the two appear in the same glass-ceramic. As will become clear in what follows, it has been discovered that in order to produce glass-ceramics having stable thermal expansion coefficients in the desired range as well as lower dielectric constants, it is necessary to develop the cordierite phase predominantly in the α form.

The method of glass preparation, grinding and green body preparation are similar to that given for the β-spodumene compositions. The average particle size for the glass powder should be in the range of 2 to 7 μm for good sintering and strength.

Table III gives the optimum sintering temperatures for the cordierite ceramics. It has also been discovered, however, that satisfactory materials can be produced at sintering temperatures spanning 80°–100° C. covered by the exothermic peak in the thermograms of the corresponding glasses. For example, composition #10 can be satisfactorily sintered at temperatures within the range of 870° C. to 950° C. and the variation of the thermal expansion coefficient for materials sintered within this range is only $\pm 1 \times 10^{-7}/°C$.

The crystalline phases developed in the different glass-ceramics are influenced by the minor constituents and in some cases by the sintering temperatures employed. Composition #8 forms α-cordierite as a major phase, together with minor amounts of μ-cordierite. Composition #9 contains μ-cordierite as the only crystalline phase. The formation of μ-cordierite confers to the glass-ceramic a somewhat higher thermal expansion coefficient as well as an apparent higher dielectric constants. It is evident that the minor constituent $Li_2O$ catalyses the formation of μ-form of cordierite. Composition #10 contains only α-cordierite due, it is believed, to the presence of boric oxide in the glass composition. Composition #11 contains μ-cordierite as the major phase along with some α-cordierite. Although the thermal expansion coefficient of this material for the sintering temperature of 925° C. falls within the desired range of 20 to $50 \times 10^{-7}/°C$., we have noted that the thermal expansion coefficient is dependent on the sintering temperature employed. Material sintered at 970° C. has an expansion coefficient of $36.4 \times 10^{-7}/°C$. and that sintered at 990° C. has the value of $40 \times 10^{-7}/°C$. The enhanced strength for composition #11 is thought to result from improved crystal nucleation promoted by the inclusion of $ZrO_2$. This nucleant, however, also promotes the formation of the μ-cordierite phase if its concentration is above a critical limit. Composition #12, containing lower concentrations of $B_2O_3$ and $ZrO_2$ compared to composition #11, develops α-cordierite as the major crystal phase together with clinoenstatite as a minor phase. The thermal expansion coefficient of this material is stable over a wide sintering temperature range. For sintering temperatures between 915° C. and 970° C., the expansion coefficient only varied for $23 \times 10^{-7}/°C$. to $24 \times 10^{-7}/°C$. The high strength of composition #12 is attributed on the basis of microscopic and x-ray diffraction studies to a high volume fraction of the crystalline phase which occurs as a crystalline network having a very small domain size. The formation of clinoenstatite minor phase in the residual glass during sintering is also likely to have contributed to the high flexural strength of this material.

Figure 3:
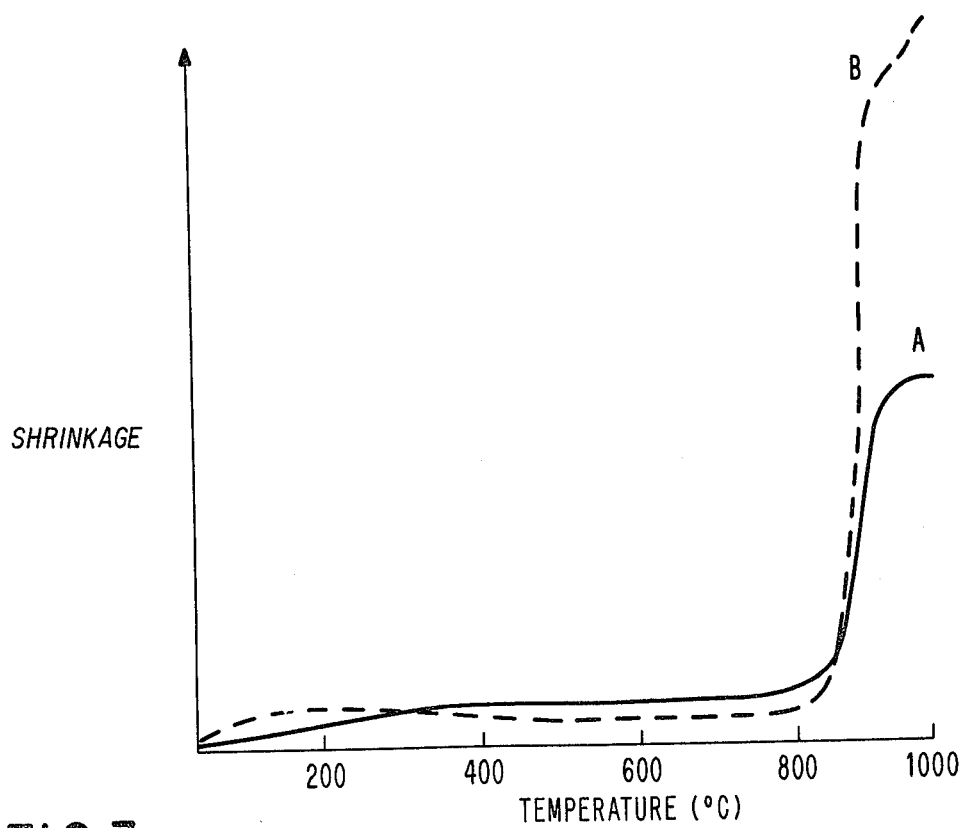
FIG. 3 shows typical dilatometric shrinkage curves for cordierite glass-ceramics of this invention.

Investigation has shown that the sintering process for the cordierite glass-ceramics is fundamentally different from that for the β-spodumene glass-ceramics. FIG. 3 shows typical shrinkage curves for a material that sinters to zero porosity below 1000° C. (Curve A, e.g. composition #10, Table III) and for a material that does not undergo complete densification below 1000° C. (Curve B, e.g. composition #8). It will be seen that unlike the β-spodumene glass-ceramics, the cordierite materials undergo sintering in a single stage. For materials that are sinterable below 1000° C., we believe that the densification involves predominantly glass-to-glass coalescence. For example, composition #10 can be sintered to negligible porosity at a temperature of 850° C. but examination of the material fired to this temperature shows very little crystallinity in it.

Based on optical and electron microscopic observations and on x-ray diffraction results, it is believed that the sintering process for these materials is as follows: After the burn-out of the organic binders, there is no further dimensional change until glass particles begin to coalesce by viscous and diffusional mechanisms, perhaps also assisted by the glass-in-glass phase separation observed in this temperature range. Soon thereafter, an interconnecting network of crystallites appears roughly delineating the prior glass particle boundaries, this leading us to believe that surface nucleation must have occurred on the individual glass grains prior to their coalescence. The formation of these highly crystalline networks acts to arrest the excessive deformation by viscous flow of the body. Internal nucleation and crystallization within the glassy domains occurs at a slightly higher temperature, this being promoted by the added nucleants such as $P_2O_5$, $ZrO_2$, $TiO_2$ and $ZnO$. This mechanism is well illustrated in an experiment in which a bundle of fibers glass #10 of each of about 0.2 mm diameter was subjected to the same thermal cycle as was used for sintering. The glass fibers sintered together at their points of contact but each fiber had developed a highly crystalline skin to a depth of about 1–2 μm. The interiors of the fibers remained largely glassy. The function of additives such as $Li_2O$ and $B_2O_3$ may well be to delay the onset of crystallization thereby allowing sintering within desired temperature range.

It is believed that the critical factors that enable the distortion-free sintering to near theoretical densities of these glass-ceramics are the following: (i) the absence a well-defined nucleation hold on the way to the sintering temperature which prevents internal nucleation and of crystallization prior to the completion of glass-to-glass sintering, (ii) the relative ease of surface nucleation compared to bulk nucleation in these glasses, such nucleation occurring despite the factor (i) above prior to glass-to-glass sintering, (iii) a clear separation between the surface nucleation and crystallization temperatures allowing the glass densification to take place to completion at temperatures in between, (iv) the onset of surface crystallization following soon after the completion of densification providing a crystallized network that prevents further viscous deformation.

Figure 4:
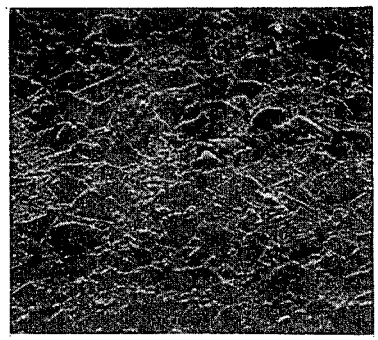
FIG. 4 is a typical photomicrograph of a sintered α-cordierite glass-ceramic of this invention (SEM 2000X).

The sintered glass-ceramics can be said to have a two-level microstructure, a cellular network of crystals on the scale of the prior glass particle dimensions (2–5 μm), forming the first level within which are formed discrete crystals of sub-micron to 1–2 μm size dispersed in the residual glassy phase. A typical microstructure is shown in FIG. 4. This unique dual microstructure is believed responsible for the high flexural strength of these sintered glass-ceramics. Furthermore, by minor additions of $Li_2O$ or $B_2O_3$, it is possible to control the form of cordierite that is formed and thus to control the thermal expansion coefficient and dielectric constant within certain limits.

The glass-ceramic of the β-spodumene type as well as of the cordierite type described above can be used for other applications besides the multilayer substrates. Such applications could be based on one or more of their properties such as their easy sinterability, low thermal expansion coefficients, low dielectric constant and high flexural strength. While some of these compositions cannot be bulk crystallized, others such as composition #1 of Table II can be used in this condition.

Also, it is to be understood that as used herein and in the claims the terms "alpha-cordierite glass" is defined as and limited to (1) a precursor for "alpha-cordierite glass ceramics", and (2) formed from a bath consisting of, by weight

| | | | |
|---|---|---|---|
| SiO$_2$ | 48 to 55% | P$_2$O$_5$ | 0 to 3% |
| Al$_2$O$_3$ | 18 to 25% | TiO$_2$ | 0 to 2.5% |
| MgO | 18 to 25% | SnO$_2$ | 0 to 2.5% |
| ZnO | 0 to 2% | ZrO$_2$ | 0 to 2.5% |

Conversely, as used herein and in the claims, the term "alpha-cordierite glass ceramic" is defined as and limited to a glass ceramic structure coalesced and crystallized from "alpha-cordierite glasses" to an article having a microstructure of a pervasive network of 2 to 5 μm crystallites of alpha-cordierite and clinoenstatite with the interstices of the network occupied by residual glass having dispersed therein discrete secondary 1 to 2 μm crystallites of clinoenstatite and additional cordierite phase.

Multilayer Substrate Fabrication

The glasses of the β-spodumene type and the cordierite type described previously can be used to fabricate multilayer glass-ceramic substrates containing co-sintered conductor patterns of gold, silver or copper. The substrate fabrication involves the following steps:

Step 1: The cullet of the chosen glass is ground to average particle sizes in the range of 2 to 7 μm. The grinding can be done in two stages—a preliminary dry or wet grinding to—400 mesh particle size followed by further grinding with suitable organic binders and solvents until the average particle size is reduced to lie between 2 to 7 μm and a castable slurry or slip is obtained. A single stage prolonged grinding of cullet in the medium of the binder and solvent until the desired particle size is obtained can also be used. In the latter case, a filtering step may be needed to remove oversized particles. By way of example, a suitable binder is polyvinyl butaryl resin with a plasticizer such as dioctophthalate or dibutyl phthalate. Other suitable polymers are polyvinyl formal, polyvinyl chloride, polyvinyl acetate or certain acrylic resins. The purposes of adding an easily evaporable solvent such as methanol is (i) to initially dissolve the binder so as to enable it to coat the individual glass particles, and (ii) to adjust the rheology of the slip or slurry for good castability.

Step 2: The slip or slurry prepared as in Step 1 is cast, in accordance with conventional techniques, into thin green sheets preferably by a doctor-blading technique.

Step 3: The cast sheets are blanked to the required dimensions in a blanking tool and via holes are punched in them in the required configuration.

Step 4: Metallizing paste of gold, silver or copper is extruded into the via holes in the individual sheets by screen printing method.

Step 5: The required conductor patterns are screen printed on to the individual green sheets of Step 4.

Step 6: A plurality of sheets prepared as in Step 5 are laminated together in registry in a laminating press.

The temperature and pressure employed for lamination should be such as to cause (i) the individual green sheets to bond to each other to yield a monolithic green substrate, (ii) to cause the green ceramic to sufficiently flow and enclose the conductor patterns.

Step 7: Firing the ceramic to the sintering temperature to accomplish binder removal, sintering of the glass particles and their concurrent conversion to glass-ceramics by crystallization, and the sintering of the metal particles in the conductor patterns to dense metal lines and vias. The particular glass-ceramic composition chosen should be one that has an optimum sintering temperature between 50°–150° C. below the melting point of the conductor metal employed.

During the firing cycle, the organic binders begin to come off at 300° C. and the binder removal is essentially complete before appreciable glass-to-glass sintering has occurred. The sintering proceeds according to the mechanisms previously outlined and results in the conversion of glass to glass ceramic state in which the crystalline phases formed occupy greater than 80% of the body by volume. The holding time at the sintering temperature can vary from 1 to 5 hours. The body is then cooled at a controlled rate not to exceed 4° C./minute to at least about 400° C. after which faster cooling rates may be used.

The critical factors governing the fabrication of a multilayer substrate to close dimensional and distortional tolerances are the following;

(i) Complete and controlled removal of organic binders during the firing cycle prior to appreciable glass-to-glass coalescence. A slow heating rate of 1° C. to 2° C. is essential for ensuring a controlled binder removal rate.

(ii) The crystallization of glass during the sintering process which arrests the tendency of the glass to deform by viscous flow.

(iii) The matching of the shrinkages of the conductor pattern and the glass-ceramic. Shrinkage of the metal paste is governed by factors such as average particle size and size distribution, particle loading in the paste and the lamination pressure. The firing shrinkage of the glass-ceramic can also be manipulated within certain limits by varying the binder-to-glass ratio in the green sheets and the lamination pressure.

It is noted that despite the large disparity in the thermal expansion coefficients of gold, silver and copper, on the one hand, and the glass-ceramics of this invention, on the other, structural integrity of the substrate is preserved because of (i) the high degree of ductility of these metals and (ii) good bonding between the metal and the glass-ceramic. The latter could be enhanced by the additions of suitable glass frits or other bonding aids to the metallizing paste.

When using copper as the metallizing paste, the firing of the substrate has to be done in non-oxidizing atmospheres. For this reason, organic binders employed for green sheet fabrication should be capable of being evaporated off in such atmospheres at reasonable temperatures.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A non-porous sintered glass ceramic article comprising:
a microstructure of a pervasive continuous network of 2 to 5 μm crystallite selected from the group consisting of β-spodumene and alphacordierite with the interstices of said β-spodumene network occupied by residual glass having dispersed therein discrete secondary 1 to 2 μm crystallites of lithium metasilicate and the interstices of said alphacordierite network occupied by residual glass having dispersed therein 1 to 2 μm crystallites of clinoenstatite.

2. A method of making a glass ceramic article comprising forming a glass from a batch containing, by weight

| 65 to 75% | SiO$_2$ | 3.5 to 11% | LiO$_2$ |
|---|---|---|---|
| 12 to 17% | Al$_2$O$_3$ | 0 to 2.5% | B$_2$O$_3$ |
| 0 to 2% | MgO | 0 to 2.5% | P$_2$O$_5$ |
| 0 to 2% | ZnO$_2$ | 0 to 3% | F | and including from 0 to 2% of at least one oxide selected from the group consisting of CaO and BaO, and from 1.0 to 3.5% of at least one oxide selected from the group consisting of Na$_2$O and K$_2$O;

pulverizing said glass to particle sizes of about 2 to about 7 μm;

shaping said glass particles into a desired configuration;

heating said shaped particles to a temperature in the range of about 870° to about 1000° C. at a rate not exceeding 2° C./minute;

sintering said shaped particles at said temperature for times in the range of 1 to 5 hours to coalesce and crystallize said particles; and cooling said sintered particles at a rate not exceeding 4° C. per minute to a temperature of at least about 400° C.

3. The method of claim 2 wherein said shaping comprises forming a sheet structure of said particles dispersed in a thermoplastic resin binder.

4. The method of claim 3 including the step of superimposing a plurality of said sheet structure on each other in a laminated structure prior to said heating step.

5. The method of claim 4 wherein at least two said sheet structures are superimposed on each other, and including forming a pattern of an electrical conductor pattern forming composition on a surface of at least one of said sheets on which a second said sheet structure is superimposed so as to sandwich said pattern therebetween; and providing means in said sheet structure for extensions of said conductor pattern to at least one surface of said laminated structure.

6. The method of claim 5 wherein said electrical conductor forming composition is comprised of a metal selected from the group consisting of copper, silver and gold and alloys containing the same.

7. The method of claim 5 including the step of mounting an integrated circuit semiconductor chip on said surface in electrical connection to a portion of said pattern extensions.

8. The method of claim 7 wherein said electrical conductor forming composition is comprised of a metal selected from the group consisting of copper, silver, gold and alloys containing the same.

9. A method of making a glass ceramic article comprising forming a glass from a batch containing, by weight

| 48 to 55% | SiO$_2$ | 0 to 3% | P$_2$O$_5$ |
|---|---|---|---|
| 18 to 25% | Al$_2$O$_3$ | 0 to 2.5% | TiO$_2$ |
| 18 to 25% | MgO | 0 to 2.5% | SnO$_2$, and |

| | | | |
|---|---|---|---|
| 0 to 2% | ZnO | 0 to 2.5% | ZrO$_2$; | pulverizing said glass to particle sizes of about 2 to about 7 μm;

shaping said glass particles into a desired configuration;

heating said shaped particles to a temperature in the range of about 870° to about 1000° C. at a rate not exceeding 2° C./minute;

sintering said shaped particles at said temperature for times in the range of 1 to 5 hours to coalesce and crystallize said particles; and cooling said sintered particles at a rate not exceeding 4° C. per minute to a temperature of at least about 400° C.

10. The method of claim 9 wherein said shaping comprises forming a sheet structure of said particles dispersed in a thermoplastic resin binder.

11. The method of claim 10 including the step of superimposing a plurality of said sheet structure on each other in a laminated structure prior to said heating step.

12. The method of claim 11 wherein at least two said sheet structures are superimposed on each other, and including forming a pattern of an electrical conductor pattern forming composition on a surfce of at least one of said sheets on which a second said sheet structure is superimposed so as to sandwich said pattern therebetween; and providing means in said sheet structure for extensions of said conductor pattern to at least one surface of said laminated structure.

13. The method of claim 12 wherein said electrical conductor forming composition is comprised of a metal selected from the group consisting of copper, silver and gold, and alloys containing the same.

14. The method of claim 12 including the step of mounting an integrated circuit semiconductor chip on said surface in electrical connection to a portion of said pattern extensions.

15. The method of claim 14 wherein said electrical conductor forming composition is comprised of a metal selected from the group consisting of copper, silver, gold and alloys containing the same.

16. A method of forming a glass ceramic composite structure comprising forming at least one green sheet comprised of a thermoplastic organic binder having dispersed therein 2 to 7 μm sized particles of glass selected from the group consisting of β-spodumene and alphacordierite glasses, forming on a surface of a first said green sheet a pattern of an electrical conductor forming composition;

superimposing a second said sheet on said surface of said first sheet to sandwich said pattern therebetween;

laminating said superimposed sheets together;

heating said laminate to a temperature in the range of about 870° C. to about 1000° C. at a rate not exceeding 2° C. per minute;

firing said laminate at said temperature to (a) decompose and eliminate said binder, and (b) to coalesce and crystallize the said glass of said laminate into a glass ceramic structure having said electrical conductor pattern extending within the interior thereof.

17. The method of claim 16 wherein said electrical conductor forming composition is comprised of a metal selected from the group consisting of copper, silver, gold and alloys containing the same.

18. The method of claim 16 including providing means for extending said pattern to at least one surface of said fired laminate.

19. The method of claim 18 wherein said electrical conductor forming composition is comprised of a metal selected from the group consisting of copper, silver, gold and alloys containing the same.

20. The method of claim 18 including mounting an integrated circuit semiconductor chip on said surface in electrical connection to a portion of said pattern extension.

* * * * *